United States Patent
Okino et al.

(12)

(10) Patent No.: US 6,277,542 B1
(45) Date of Patent: Aug. 21, 2001

(54) CHARGED-PARTICLE-BEAM PROJECTION-EXPOSURE METHODS EXHIBITING MORE UNIFORM BEAM-CURRENT DENSITY

(75) Inventors: Teruaki Okino, Kamakura; Shintaro Kawata, Ibaraki-ken, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/327,403

(22) Filed: Jun. 7, 1999

(30) Foreign Application Priority Data

Jun. 5, 1998 (JP) .................................... 10-172112

(51) Int. Cl.⁷ .................................. G03F 9/00; G03C 5/00
(52) U.S. Cl. .............................. 430/296; 430/30; 430/942
(58) Field of Search .................................... 430/296, 942, 430/30

(56) References Cited

U.S. PATENT DOCUMENTS 5,821,014 * 10/1998 Chen et al. .............................. 430/30
5,879,844 * 3/1999 Yamamoto et al. .................... 430/30

FOREIGN PATENT DOCUMENTS 11-95406   4/1999 (JP) .

OTHER PUBLICATIONS

Liddle et al., "Proximity Effect Correction in Projection Electron Beam Lithography (Scattering with Angular Limitation Projection Electron–Beam Lithography)," *Jpn. J. Appl. Phys.* 34:6672–6678 (1995).

* cited by examiner

*Primary Examiner*—Christopher G. Young
(74) *Attorney, Agent, or Firm*—Klarquist Sparkman Campbell Leigh & Whinston LLP

(57) ABSTRACT

Methods are disclosed for reducing distortions, differences in focal point-positions, and astigmatic blurring of a pattern defined on a reticle and projected onto a sensitive substrate using a charged particle beam. The methods reduce variations in the distribution of beam current as projected onto the substrate. To such end, a charged particle beam passing through pattern features as defined on the reticle is projected onto a region on the substrate. The reticle is provided with multiple "micro features" each having a size less than the resolution limit of the projection-optical system. The micro features can be provided on a portion of the reticle having a low feature density.

26 Claims, 5 Drawing Sheets

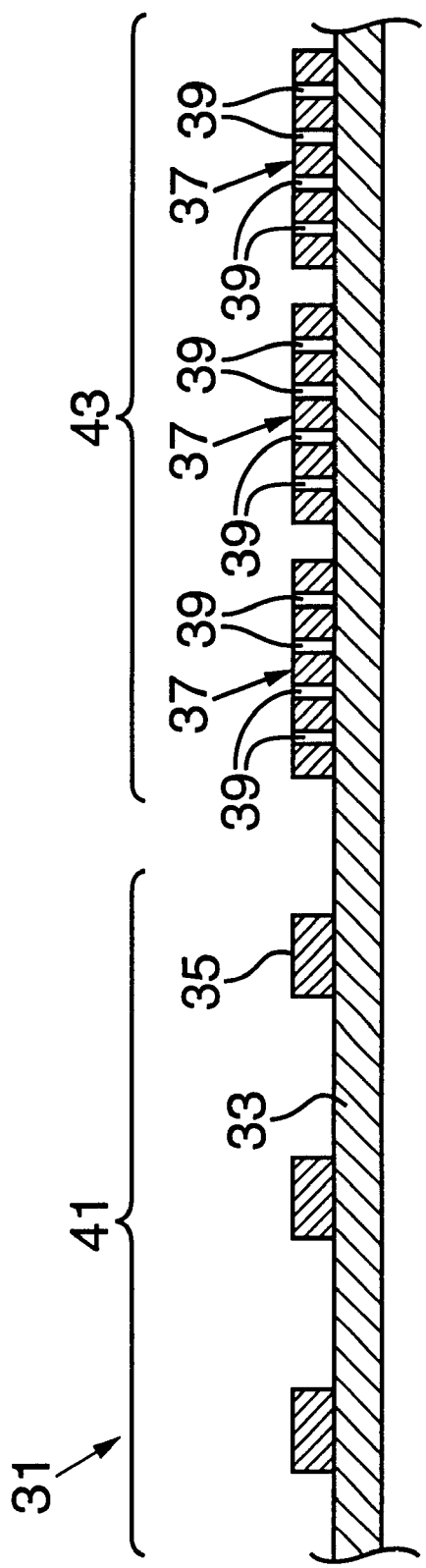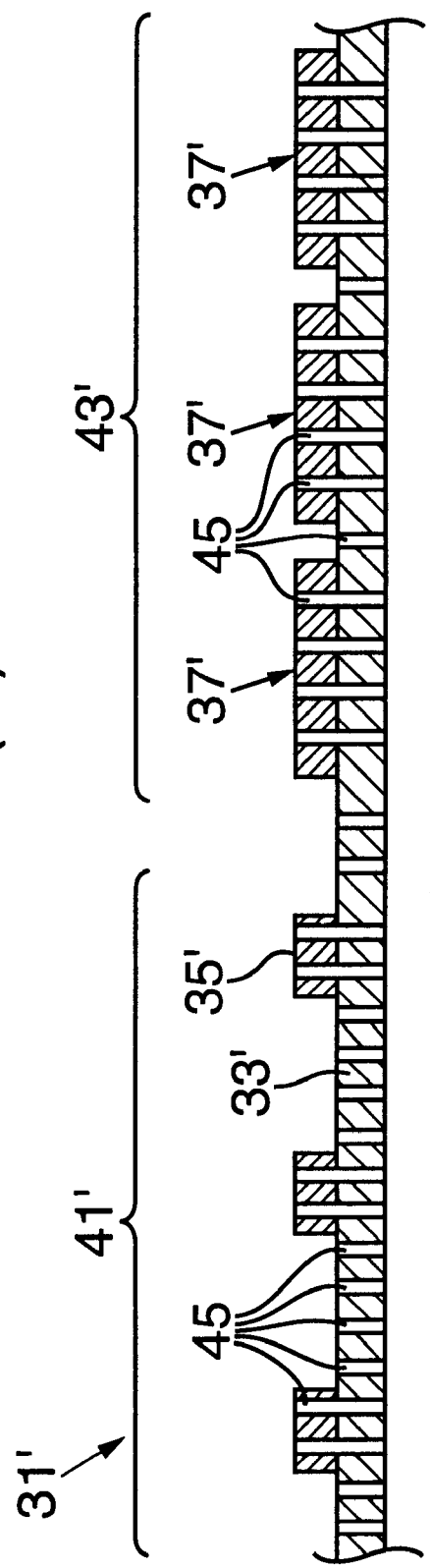

LITHOGRAPHY STEP

CHARGED-PARTICLE-BEAM PROJECTION-EXPOSURE METHODS EXHIBITING MORE UNIFORM BEAM-CURRENT DENSITY

FIELD OF THE INVENTION

The present invention pertains to microlithography reticles and methods for their use in transferring a pattern defined on the reticle to a suitable sensitized substrate using a charged particle beam (e.g., electron beam or ion beam). Such reticles and methods have especial utility in the manufacture of semiconductor devices and displays. More specifically, the invention is directed to reducing errors in focal-point positions, distortions, and astigmatic blurring of transferred patterns caused by the Coulomb effect and related effects.

BACKGROUND OF THE INVENTION

Conventional electron-beam microlithography apparatus offer prospects of high-accuracy and high-resolution exposures but suffer from low throughput. Various technologies have been investigated in efforts to correct this fault. For example, certain pattern-portion batch exposure methods such as "cell projection," "character projection," and "block exposure" methods have received considerable attention. In a pattern-portion batch exposure method, small portions (e.g., 5 µm square units of a pattern defining a memory portion) of an overall pattern (e.g., of an entire integrated circuit) that are repeated many times in the overall pattern are defined by respective regions on the reticle. The region on the reticle corresponding to the small portion is typically used repeatedly many times during the transfer of a die pattern to the substrate (e.g., semiconductor wafer) to form the overall pattern on the substrate. Portions of the overall pattern that are not repeated are typically transferred using a different method such drawing using a variable shaped beam. Unfortunately, such methods have very low throughput.

An electron-beam "reduction" (i.e., demagnifying) projection-transfer apparatus has been proposed that purportedly achieves higher throughput than pattern-portion batch exposure methods. In this type of projection-transfer apparatus, the reticle defines the entire die pattern (i.e., the entire pattern destined to be exposed onto a separate "chip" on the substrate). The pattern on the reticle is typically divided ("segmented") into multiple exposure units that are exposed sequentially by the electron beam onto the substrate. As the electron beam passes through an exposure unit, an image of the respective exposure unit is formed on a corresponding region of the substrate using a projection lens. The image is demagnified as projected onto the substrate, by which is meant that the image is smaller than the corresponding exposure unit as defined on the reticle.

In an attempt to improve the throughput of divided projection-transfer methods and apparatus, simultaneous irradiation of the entire reticle (i.e., "batch" exposure of the entire reticle defining an entire die pattern or even multiple die patterns) has been proposed. Unfortunately, such a technique exhibits poor transfer accuracy and poor edge resolution. It is also very difficult to produce a reticle that defines an entire die pattern (or multiple die patterns) to be transferred in one "shot" to the substrate.

Hence, divided projection exposure remains the favored technique for achieving projection exposure using a charged particle beam. According to one approach in divided projection exposure, the optical field of the projection-optical system is increased to allow projection of larger portions of the pattern during each shot. In any event, in divided projection-exposure methods, aberrations can arise during exposure of each exposure unit. Certain conventional divided projection-exposure apparatus achieve real-time correction of aberrations such as distortion or variations in the focal points of the images of the exposure units as formed on the substrate. Such corrections tend to improve the resolution and accuracy of pattern transfer over the entire die region compared to batch-transfer methods.

In exposure apparatus that employ a charged particle beam, exposed patterns can exhibit blurring (e.g., astigmatic blurring) and distortion. In a conventional variable-spot method or cell-projection method, each exposure unit is typically less than about 5 µm square. In the conventional divided transfer methods and apparatus summarized above, the exposure units are typically larger, approximately 100 µm square or larger (to increase throughput). With such large exposure units (each defining a respective portion of the overall pattern), if the features of the respective pattern portion are not evenly distributed, then the Coulomb effect can have a variable effect on image quality depending upon the distribution of pattern features in the exposure unit.

An example of an exposure unit having a non-uniform distribution of pattern features is shown in FIG. 5. In FIG. 5, the exposure unit 81 comprises multiple pattern features 87, 89. The features 87 are smaller than and spaced farther apart than the features 89. Also, the features 87 are congregated in a region 83 and the features 89 are congregated in a region 85. Hence, the feature density in the region 83 is lower than the feature density in the region 85. Each of the features 87 and 89 is defined on the reticle as an aperture (if the reticle is a stencil reticle) or a local region highly transmissive to charged particles (if the reticle is a membrane reticle). Hence, charged particles passing through any of the features 87, 89 apply a corresponding local dosage of charged particles on the substrate. (Such features are termed "positive" features.) The complementary portions of the exposure unit 81 tend to block transmission of charged particles and are termed "negative" features.

In FIG. 5, the higher-density region 85 within the exposure unit 81 has a feature density of 50% and the lower-density region 83 has a feature density of 10%. The local beam current of the beam passing through the higher-density region 85 will be higher than the local beam current of the beam passing through the lower-density region 85. As a result, the Coulomb effect will be more pronounced in the higher-density region 85. The differential impact of the Coulomb effect causes the point of best focus of the beam passing through the higher-density region 85 to be axially displaced relative to the point of best focus of the beam passing through the lower-density region 83.

Conventionally, transfer of the exposure unit 81 is performed at a "compromise" focal point for the regions 83 and 85. The compromise focal point, however, is not optimal for either of the regions 83, 85. This results in a corresponding decrease in overall resolution of the transferred image of the exposure unit 81 than if each region 83, 85 were exposed separately. The distortion in an image of an exposure unit 81 as projected is also different than any distortion in an image of an exposure unit with a more uniform feature density.

SUMMARY OF THE INVENTION

In view of the shortcomings of conventional methods and apparatus as summarized above, an object of the invention is to provide, inter alia, charged-particle-beam (CPB) projection-exposure methods that reduce variations in focal-point positions, distortions, or astigmatic blurring of the transferred pattern caused by variations in the Coulomb effect originating from variations in the beam-current distribution over the pattern as transferred to the substrate.

To such end, and according to a first aspect of the invention, methods are provided for projection-exposing a pattern onto a sensitive substrate using a charged particle beam and a projection-optical system. According to a representative embodiment of such a method, the pattern is defined on a reticle. The reticle defines multiple features of the pattern. The reticle also defines multiple "micro features" (as defined herein) each sized below a resolution limit of the projection-optical system. A region of the reticle is illuminated using the charged particle beam such that a portion of the charged particle beam passing through the illuminated region of the reticle becomes an imaging beam. The imaging beam is projected through the projection-optical system onto the sensitive substrate to form an image of the region of the reticle on a corresponding region of the sensitive substrate. The micro features transmit charged particles in the beam from the reticle to the substrate and thus change an exposure condition of the corresponding region of the substrate relative to the exposure condition that would otherwise be achieved if the reticle lacked the micro features. A representative exposure condition is a beam-current distribution over the region that serves to reduce distortion over the region, astigmatic blurring over the region, and/or local focus variations over the region caused by the Coulomb effect. For example, the methods can make a beam-current distribution on the corresponding region of the substrate more uniform over the region than would otherwise be achieved if the reticle lacked the micro features.

Various types of reticles can be used with such methods. For example, the reticle can be a stencil reticle, in which instance the pattern as defined on the reticle can be divided into multiple exposure units, wherein at least one exposure unit can include a highfeature-density portion and a low-feature-density portion. Stencil reticles comprise a reticle "plate." The reticle plate can be an "absorption" type by which is meant that the reticle plate is made of a material that tends to absorb charged particles of an incident charged particle beam. Alternatively, the reticle plate can be a "scattering" type by which is meant that the reticle plate is made of a material that tends to scatter charged particles of an incident beam. In either instance, the features of the pattern are defined by respective apertures extending through the thickness dimension of the reticle plate, and the micro features are located at least in the low-feature-density portion.

Alternatively, the reticle can be a so-called "membrane" reticle. A membrane reticle comprises a reticle membrane having a relatively high transmissivity to charged particles in the beam. The reticle membrane has formed thereon multiple negative features formed of a material tending to scatter or absorb more charged particles than absorbed or scattered by the reticle membrane. The reticle also defines multiple micro features each sized below a resolution limit of the projection-optical system. A region of the reticle is illuminated using a charged particle beam such that a portion of the charged particle beam passing through the illuminated region of the reticle becomes an imaging beam. The imaging beam is projected through the projection-optical system onto the sensitive substrate to form an image of the region of the reticle on a corresponding region of the sensitive substrate. The micro features transmit charged particles in the beam from the reticle to the substrate and thus make a beam-current distribution on the corresponding region of the substrate more uniform over the region than would otherwise be achieved if the reticle lacked the micro features. The pattern as defined on the reticle can have a highfeature-density portion and a low-feature-density portion, wherein the micro features are defined at least in the low-feature-density portion. The micro features can be defined also in the high-feature-density portion. Further alternatively, the micro features can be defined over the entire reticle regardless of feature density of various portions of the reticle.

Any of the foregoing methods can further include the step of correcting, based on the more uniform beam-current distribution that is achieved, at least one of a focal-point position, distortion, and astigmatic blurring of the image as formed on the substrate.

According to another aspect of the invention, reticles are provided that define a pattern to be transferred to a region on a sensitive substrate using a charged particle beam passing through the reticle and a projection-optical system to the substrate. One embodiment of such a reticle comprises features of the pattern and defines micro features extending at least partly through a thickness dimension of the reticle. The micro features are smaller than a resolution limit of the projection-optical system. The micro features transmit charged particles in the beam from the reticle to the substrate so as to achieve a beam-current distribution on the region of the substrate that is more uniform over the region than would otherwise be achieved if the reticle lacked the micro features.

Regardless of whether the reticle is a stencil reticle or a membrane reticle, the pattern as defined on the reticle can be divided into multiple exposure units. At least one exposure unit can include a high-feature-density portion and a low-feature-density portion. The micro features are defined in the low-feature-density portion. In a stencil reticle, the pattern features are defined by apertures (through holes) in the reticle plate. The reticle plate can be made of a CPB-scattering material or a CPB-absorbing material, and the micro features are defined by apertures (through holes) in the reticle plate.

According to another embodiment, the reticle defines a pattern to be transferred to a region on a sensitive substrate using a charged particle beam passing through the reticle and a projection-optical system to the substrate. The reticle comprises a reticle membrane having a relatively high transmissivity to charged particles in the beam. The reticle membrane has formed thereon multiple negative features formed of a material tending to scatter or absorb more charged particles than absorbed or scattered by the reticle membrane. The reticle also defines multiple micro features each sized below a resolution limit of the projection-optical system. The micro features can be defined by the reticle membrane having a relatively high transmissivity or by through-holes in the reticle. The micro features desirably transmit charged particles in the beam from the reticle to the substrate. As a result, the beam-current distribution on the corresponding region of the substrate is more uniform over the region than would otherwise be achieved if the reticle lacked the micro features.

By providing the micro features on the reticle, especially in a low-feature-density region of the reticle, the feature density in the corresponding region of the reticle is made more uniform overall. Because the micro features are not resolved by the projection-exposure system, images of the micro features are projected onto the substrate in a blurred manner. Thus, the specific pattern of micro features defined on the reticle is not transferred to the substrate. However, because charged particles of the beam pass from the micro features to the substrate, such charged particles contribute to the Coulomb effect. Such a contribution desirably causes any distortion and/or blurring at the substrate to be made more uniform. Such greater uniformity allows better correction of projection accuracy and resolution overall.

In addition to methods (e.g., "divided" projection-exposure methods involving a divided or "segmented" reticle), the present invention is also applicable to methods in which the pattern is transferred using, e.g., a cell-projection method. In a cell-projection method, portions of the whole pattern are transferred using separate reticles, and any remaining portions of the pattern are drawn on the substrate using, e.g., a variable-shaped beam or a Gaussian beam.

In yet other methods according to the invention, a reticle is provided that defines, in addition to actual ("real") pattern features, "dummy" features. Dummy features desirably are located in low-feature-density regions of the reticle and are situated such that, when projected onto the substrate, they do not interfere with the function of the "real" features. Hence, a dummy feature can be of a size that is resolvable by the projection-optical system. But, even if the dummy feature is resolved onto the substrate, it is inconsequential because it has no effect on the overall pattern. Dummy features do, however, provide any of the various advantages of the micro features discussed herein.

The foregoing and other features and advantages of the invention will be more apparent from the following detailed description, which proceeds with reference to the accompanying drawings.

BRIEF DESCRIPTION OF THE DRAWINGS

FIGS. 3(A)–3(B) show vertical sections of two possible membrane reticles according to first and second representative embodiments of the invention.

DETAILED DESCRIPTION

A representative embodiment of the invention is described below that utilizes an electron beam as a representative charged particle beam. However, it will be understood that the principles discussed below can be applied with equal facility to an embodiment utilizing an alternative charged particle beam such as an ion beam.

Figure 4:
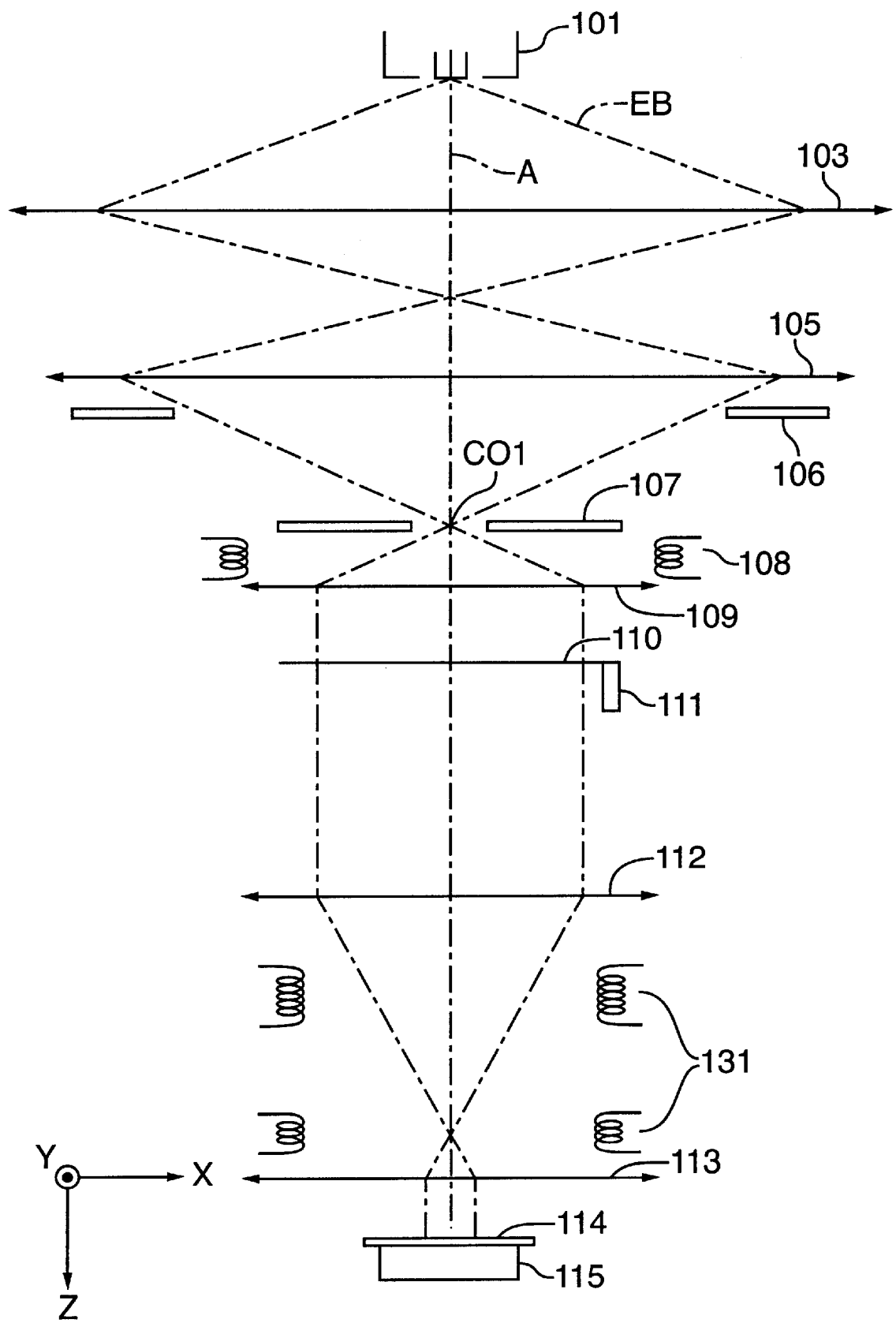
FIG. 4 is a schematic optical diagram of image-forming relationships in a charged-particle-beam projection-exposure apparatus that can utilize a reticle and/or a method according to the invention.
Figure 5:
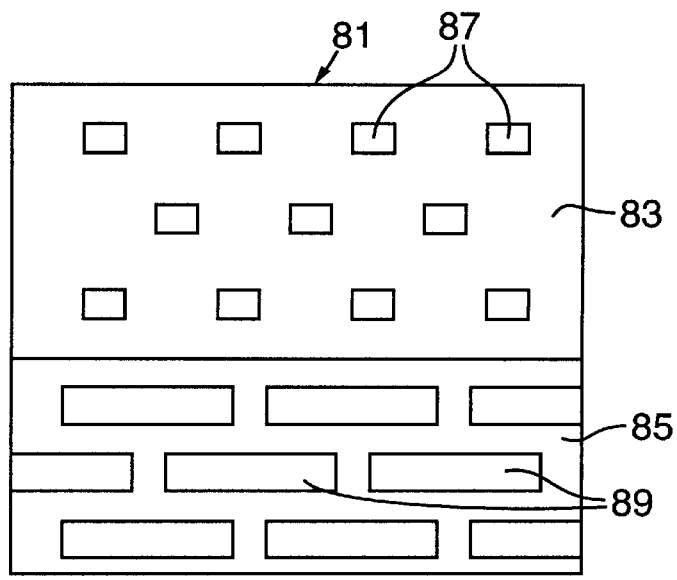
FIG. 5 is a plan view of a stencil reticle illustrating differences in feature density in two different regions of an exposure unit of the reticle.

Certain optical relationships are schematically depicted in FIG. 4, which shows an entire optical system of an electron-beam projection-exposure apparatus according to the invention. The electron beam EB is produced by an electron gun 101 and propagates downstream away from the electron gun 101 along an optical axis A. The beam then passes through first and second condenser lenses 103, 105 situated downstream of the electron gun 101. The condenser lenses 103, 105 converge the beam EB at a crossover CO1 located on the axis A at a blanking aperture 107.

A beam-shaping aperture 106 (e.g., defining a rectangular opening) is situated just downstream of the condenser lens 105. The beam-shaping aperture 106 only transmits a portion of the electron beam having a transverse profile that matches the dimensions of an exposure unit on the reticle 110. An image of the beam-shaping aperture 106 is formed on the reticle 110 by a collimating lens 109.

Upstream of the reticle 110, the beam is termed an "illumination beam," and downstream of the reticle 110, the beam is termed an "imaging beam." Between the blanking aperture 107 and the collimating lens is a deflector 108. The deflector 108 successively scans the illumination beam in the X-direction of FIG. 4 so as to sequentially illuminate each exposure unit of the reticle 110. The collimating lens 109, situated downstream of the deflector 108, forms the illumination beam into a parallel beam that is incident on the reticle 110. As the illumination beam strikes the reticle 110, the beam forms an image of the beam-shaping aperture 106 on the illuminated exposure region of the reticle 110.

In FIG. 4, the reticle 110 is represented by one exposure unit situated on the optical axis A. Actually, the reticle 110 comprises many separate exposure units extending in the X and Y directions. To illuminate each exposure unit, the illumination beam is deflected as required by the deflector 108.

The reticle 110 is mounted on a reticle stage 111 that is movable in the X and Y directions. In addition, the substrate ("wafer") 114 is mounted on a wafer stage 115 movable in the X and Y directions. During exposure, the reticle stage 111 and the wafer stage 115 are scanned in opposite directions along the Y-axis to sequentially select successive exposure units for exposure. Each exposure unit of the die pattern defined on the reticle 110 is illuminated and exposed. Each stage 111, 115 includes a respective stage-position measurement system (not shown) each employing at least one laser interferometer (not shown). As exposed onto the wafer 114, images of the exposure units are accurately joined ("stitched") together by the action of an alignment means and by adjustment of each deflector in the optical system.

First and second projection lenses 112, 113 and a deflector system 131 (wherein the lenses 112, 113 and deflector system 131 are collectively termed a "projection-optical system") are situated downstream of the reticle 110. The illumination beam illuminates one exposure unit at a time on the reticle 110. The imaging beam, patterned by passage through the illuminated exposure unit on the reticle 110, is demagnified by passage through the projection lenses 112, 113. The imaging beam is deflected as required by the deflector system 131 to form an image of the exposure unit at the desired fixed location on the wafer 114.

The wafer 114 is coated with an appropriate resist so as to be imprinted with the projected images. As each exposure unit is illuminated, each corresponding region on the wafer surface is exposed with a respective dose of electrons to form the demagnified image of the illuminated exposure unit on the wafer 114. The wafer stage 114 is movable in the X and Y directions to ensure that the image of the illuminated exposure unit is placed at a desired location on the wafer 114.

Figure 1:
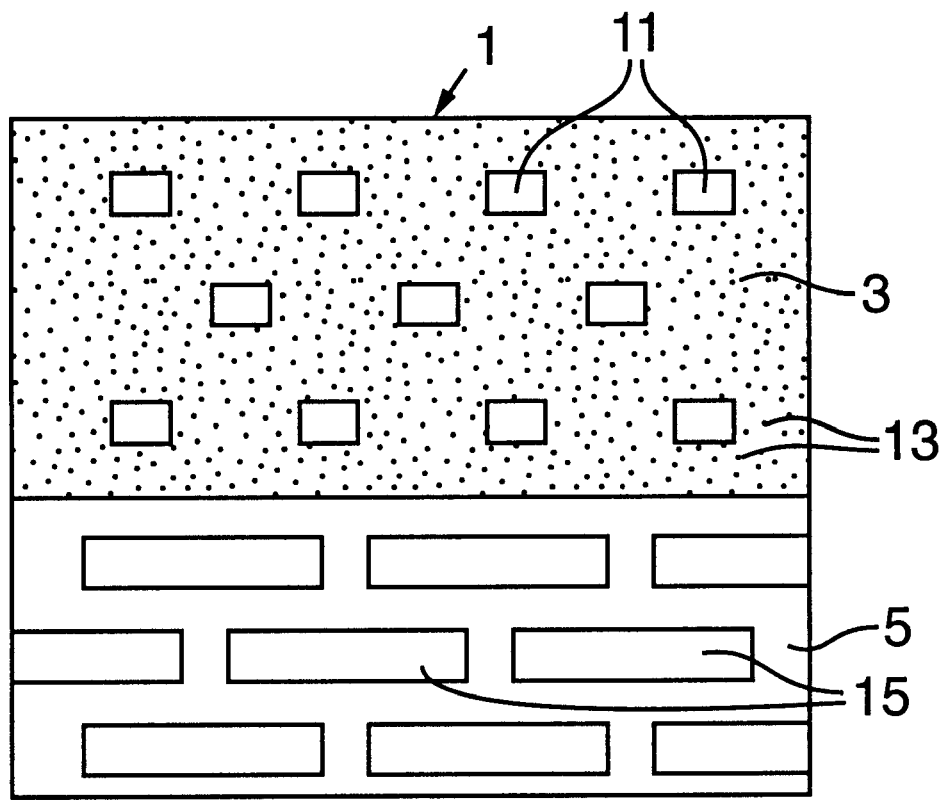
FIG. 1 is a plan view of a stencil reticle according to a first representative embodiment of the present invention.

A first representative embodiment of a reticle and method for its use is shown in FIG. 1. The reticle of this embodiment is a stencil reticle of which an exemplary exposure unit 1 is shown. The exposure unit 1 comprises features 11, 15. Each feature is defined as a corresponding aperture in a thin silicon membrane or "plate" (having a thickness of, e.g., 1 $\mu$m). The silicon plate scatters or absorbs charged particles of the illumination beam, and the feature apertures transmit charged particles of the illumination beam. Consequently, the feature apertures define "positive" features and the reticle plate defines "negative" features. The exposure unit 1 is shaped, e.g., as a square with 1-mm sides on the reticle. The entire exposure unit 1 is exposed with the illumination beam; an image of the exposure unit is demagnified and transferred to a corresponding region on the wafer 114. If the demagnification ratio is 1/4, the exposed region (corresponding to the exposure unit 1) on the wafer is a square with 250-$\mu$m sides. To form the entire die on the wafer (corresponding to the entire die for a layer of a semiconductor device formed on the wafer), the reticle will typically have a few thousand to several tens of thousands of exposure units.

The exposure unit 1 shown in FIG. 1 comprises a low-density portion 3 in which multiple small rectangular features (positive features) 11 are dispersed comparatively sparsely. Because the FIG. 1 reticle is a stencil reticle, each positive feature 11 is defined as a corresponding aperture in the reticle plate. The exposure unit 1 also comprises a high-density portion 5 in which multiple large rectangular positive features 15 are dispersed comparatively densely. Again, because this reticle is a stencil reticle, each feature 15 is defined as a corresponding aperture in the reticle membrane. By way of example, the feature density of the low-density portion 3 is 10% and the feature density of the high-density portion 5 is 50%.

In this embodiment, the low-density portion 3 also comprises multiple "micro features" 13 situated between the positive features 11 (i.e., the micro features are situated in negative features). As used herein, a "micro feature" is an aperture defined by the reticle having a size that cannot be resolved as a distinct corresponding positive feature on the substrate by the projection-optical system. I.e., each micro feature is sized below the resolution limit of the projection-optical system. Each micro feature 13 can be, e.g., a square aperture (not detailed in drawing) measuring 0.08 $\mu$m on each side, and the micro features 13 can be spaced apart from one another by intervals of 0.12 $\mu$m. Other exemplary shapes of the micro features are circles and rectangles. The presence of the micro features 13 in addition to the positive features 11 in the low-density portion 3 yields a total feature density in the low-density portion 3 of approximately 50%. The micro features 13 also provide a concomitant improvement in the uniformity of the feature density of the low-density portion 3 compared to the high-density portion 5.

Assuming a demagnification ratio of 1/4 and assuming the micro features 13 can be resolved on the wafer, each micro feature 13 (if square shaped as described above) would form a corresponding 0.02-$\mu$m square feature on the wafer. However, the resolution of the projection-optical system is typically approximately 0.08 $\mu$m as projected onto the wafer.

Consequently, the image of each micro feature 13 as projected on the wafer is blurred without any resolution of the image of the micro feature.

Figure 2:
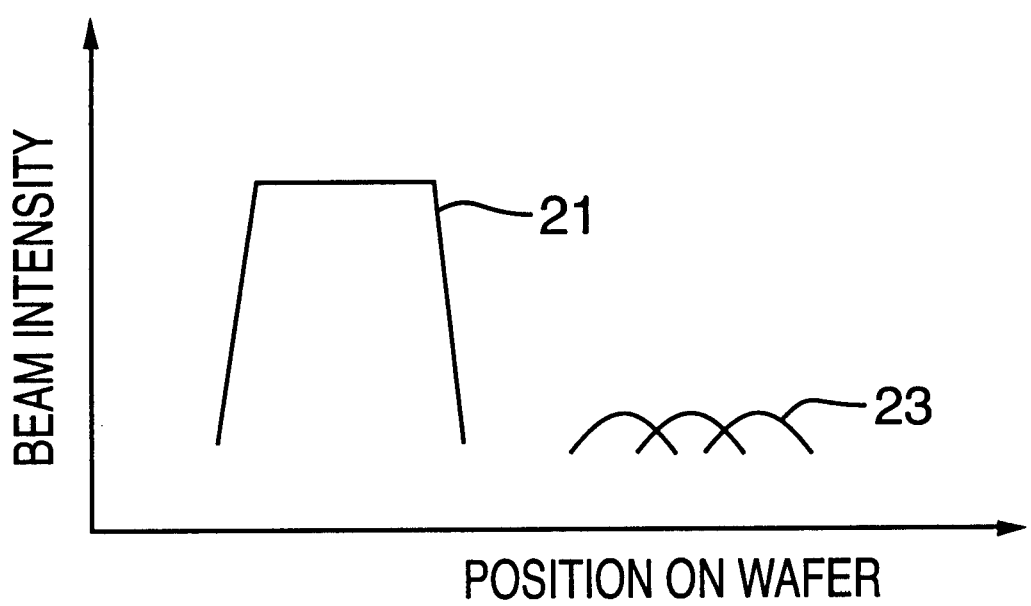
FIG. 2 includes plots showing differences in local beam intensity produced by an ordinary pattern feature on the FIG. 1 reticle versus by an array of micro features on the reticle. The horizontal axis is the position on the wafer and the vertical axis is the beam intensity on the wafer.

This is illustrated in FIG. 2, which includes a graph showing typical differences in beam intensity (on the wafer) between an ordinary feature (such as the positive feature 11) and a micro feature 13. In FIG. 2, the abscissa is the position on the wafer and the ordinate is beam intensity. Normally, the beam intensity passing through the positive feature 11 rises sharply along the edges of the feature as projected, as indicated by the plot 21. In contrast, the beam passing through adjacent micro features 13 produces low and extended intensity profiles as indicated by the plots 23. Thus, the exposures represented by the plots 23 produce background noise only with very little contrast. Therefore, the micro features 13 are not transferred as recognizable corresponding features on the wafer.

Particles of the beam passing through the micro features 13 are influenced by the Coulomb effect. However, due to the improved feature-density uniformity in the low-density portion 3 relative to the high-density portion 5 as a result of micro features 13 being present in the low-density portion 3, distortion and blurring within an image of the entire exposure unit 1 are more uniform. As a result, distortion correction over the entire image of the exposure unit 1 is simplified and provides greater accuracy and resolution of the positive features 11, 15 as transferred to the wafer.

A second representative embodiment of a reticle and method for its use is shown in FIGS. 3(A) and 3(B). The reticle of FIG. 3(A) (only a single exposure unit 31 is shown) is a "membrane" reticle comprising scattering bodies 35, 37 arranged on a membrane 33. (The "scattering" bodies 35, 37 can either scatter or absorb charged particles of the illumination beam, depending upon the specific reticle. However, for ease of discussion herein, they are referred to simply as "scattering" bodies.) Each scattering body 35, 37 has a thickness of, for example, 0.5 $\mu$m, and comprises a heavy metal such as tungsten or tantalum. The scattering bodies 35, 37 constitute negative features arranged on the membrane 33. The membrane 33 is typically made of silicon (and has a thickness of, for example, 0.1 $\mu$m). Regions of the membrane 33 lacking a scattering body 35, 37 do not cause significant scattering or absorption of electrons in the illumination beam passing through such regions. In contrast, electrons in the beam that encounter a scattering body 35, 37 are substantially scattered or absorbed.

Portions of the beam passing only through the membrane 33 have a relatively high beam current compared to beam portions that pass through both a scattering body and the membrane 33. In any event, highly scattered electrons passing through the reticle can be blocked from reaching the wafer by placing a scattering aperture between the projection lenses 112, 113 of FIG. 4. Thus, an image with acceptable contrast can be formed on the wafer.

The exposure unit 31 of FIG. 3(A) comprises a high-feature-density portion 41 in which the feature density (as projected onto the wafer) is comparatively high and a low-feature-density portion 43 in which the feature density (as projected onto the wafer) is comparatively low. I.e., the distribution of negative features 35 in the high-feature-density portion 41 is sparse, yielding a correspondingly dense distribution of positive features in that portion. Similarly, the distribution of negative features 37 in the low-feature-density portion 43 is dense, yielding a correspondingly sparse distribution of positive features in that portion. As a result, the average current of the beam passing through the high-feature-density portion 41 is substantially higher than the average current passing through the low-feature-density portion 43. This discrepancy in beam current yields a different magnitude of the Coulomb effect in the high-feature-density portion 41 compared to the low-feature-density portion 43.

To alleviate the difference in Coulomb effect within a single exposure unit 31, multiple small "micro features" 39 are defined by and extend through the scattering bodies 37 parallel to the optical axis in the low-density portion 43. The micro features 39 serve to increase the average beam current passing through the low-density portion 43 and hence reduce the difference in beam current between the portions 41, 43. The micro features 39 can be formed in the scattering bodies 37 by any of various suitable techniques such as etching.

Turning now to the reticle of FIG. 3(B), an exposure unit 31' is shown that comprises a high-feature-density portion 41' and a low-feature-density portion 43'. The high-feature-density portion 41' comprises scattering bodies 35', and the low-feature-density portion 43' comprises scattering bodies 37'. The scattering bodies 35', 37' each define a respective negative feature as projected onto the wafer. Micro features 45 extend (desirably parallel to the optical axis) not only through the scattering bodies 35' and the scattering bodies 37' (i.e., through the negative features) but also through the underlying membrane 33' without distinction between the high-feature-density portion 41' and the low-feature-density portion 43'. In addition, micro features 45 can be provided that extend through the membrane 33' in positive features in the low-feature-density portion 41' and optionally also in the high-feature-density portion 43'. Because the micro features 45 can be formed by any of various techniques such as ion-beam etching, the FIG. 3(B) reticle can be manufactured simply.

Figure 6:
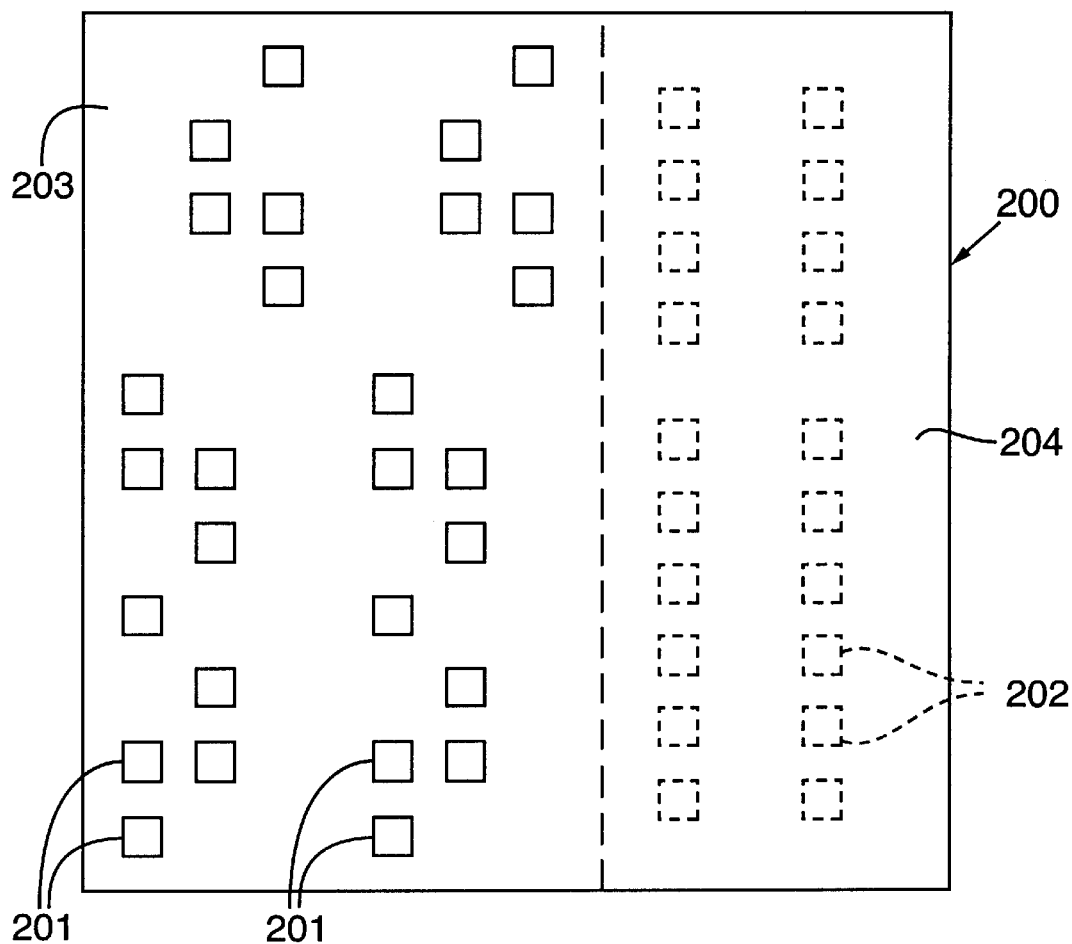
FIG. 6 is a plan view of a portion of a reticle, according to the invention, including "dummy" features as well as "real" features.

As an alternative to methods and reticles configured as described above, the present invention also encompasses reticles (and methods for their use) that include "dummy" features. Dummy features are features that are resolvable by the CPB optical system but do not contribute to the overall functional pattern as projected onto the substrate. Nevertheless, dummy features can provide a more uniform beam current from one area to another as projected onto the substrate. An example of a reticle defining dummy features is shown in FIG. 6, which specifically depicts a portion 200 of a reticle. The portion 200 defines multiple actual pattern features 201 represented by solid-line squares dispersed in a high-feature-density region 203. The portion 200 also defines dummy features 202 represented by dashed-line squares dispersed in a low-feature-density region 204. By way of example, the features 201 are sized on the reticle to produce $(0.1 \ \mu m)^2$ corresponding features on the reticle. Similarly, the dummy features 202 are sized on the reticle to produce $(0.1 \ \mu m)^2$ corresponding features on the substrate. (However, it will be understood that the dummy features need not be the same size or configuration as the "real" features.) The dummy features 202 differ from the "real" features 201 in that the dummy features, as formed on the substrate, contribute nothing to the overall functional pattern transferred to the substrate, even though the dummy features 202, like the "real" features 201, can be resolved by the projection-optical system. Even though the dummy features 202 are resolved, it is of no consequence because the dummy features are situated deliberately in regions not occupied by "real" features and that do not interfere with the function of the "real" features.

Figure 7:
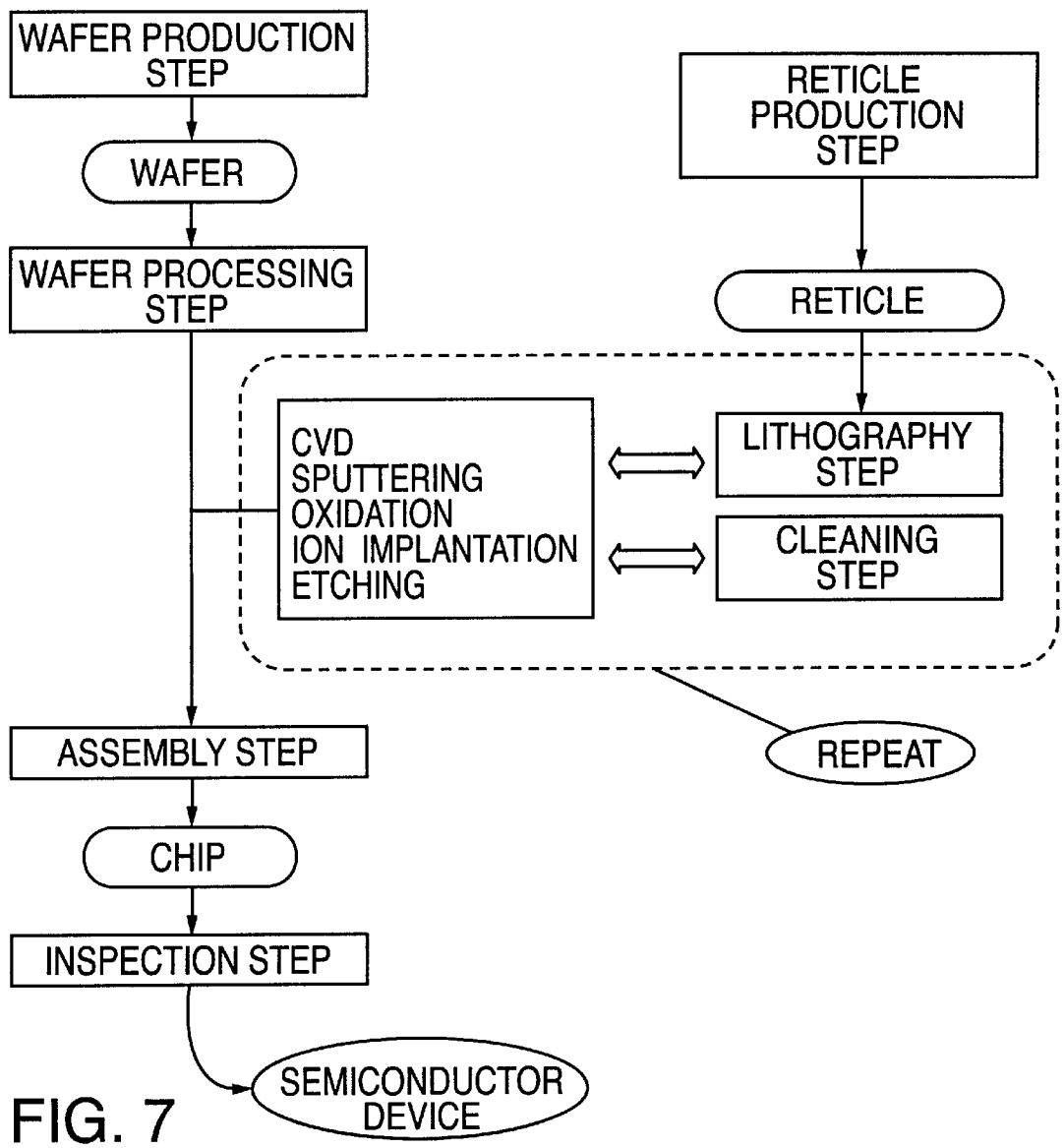
FIG. 7 is a process flowchart for manufacturing a semiconductor device, wherein the process includes a microlithography method according to the invention.

FIG. 7 is a flowchart of an exemplary semiconductor fabrication method to which reticles and methods according to the invention can be readily applied. The fabrication method generally comprises the main steps of wafer production (wafer preparation), reticle production (reticle preparation), wafer processing, device assembly, and inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, wherein the formation of each layer typically involves multiple sub-steps. Usually, many operative semiconductor devices are produced on each wafer.

Typical wafer-processing steps include: (1) thin-film formation involving formation of a dielectric layer for electrical insulation or a metal layer for connecting wires; (2) microlithography to form a resist pattern for selective processing of the thin film or the substrate itself; (3) etching or analogous step to etch the thin film or substrate according to the resist pattern, or doping as required to implant ions or impurities into the thin film or substrate according to the resist pattern; (4) resist stripping to remove the resist from the wafer; and (5) chip inspection. Wafer processing is repeated as required (typically many times) to fabricate the desired semiconductor chips on the wafer.

Figure 8:
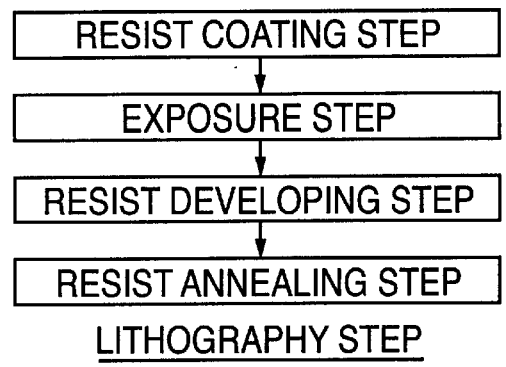
FIG. 8 is a process flowchart for performing a microlithography method that includes a projection-exposure method according to the invention.

FIG. 8 provides a flow chart of typical steps performed in microlithography, which is a principal step in wafer processing. The microlithography step typically includes: (1) resist-coating step, wherein a suitable resist is coated on the wafer substrate (which can include a circuit element formed in a previous wafer-processing step; (2) exposure step, to expose the resist with the desired pattern; (3) development step, to develop the exposed resist; and (4) annealing step, to enhance the durability of the resist pattern. Microlithography also requires a reticle, which can be a reticle as described herein.

Reticles and methods according to the invention can be applied to a semiconductor fabrication process, as summarized above, to provide substantially improved pattern-transfer resolution and accuracy without sacrificing throughput.

Therefore, the present invention provides reticles, and methods for their use, that render more uniform image distortion and blurring within individual exposure units and from one exposure unit to another. As a result, projection microlithography using a charged particle beam can be performed with greater accuracy and resolution of pattern features on the wafer.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A method for projection-exposing a pattern onto a sensitive substrate using a charged particle beam and a projection-optical system, the method comprising the steps:
    (a) defining the pattern on a reticle, the reticle including multiple exposure units each defining a respective portion of the pattern and including at least one multiple-feature exposure unit defining multiple features of the pattern arranged in a high-feature-density portion and a low-feature-density portion of the exposure unit, the low-feature-density portion also defining multiple micro features each sized below a resolution limit of the projection-optical system;

(b) illuminating the multiple-feature exposure unit of the reticle using the charged particle beam to produce an imaging beam; and (c) projecting the imaging beam through the projection-optical system onto the sensitive substrate to form an image of the multiple-feature exposure unit on a corresponding region of the sensitive substrate, wherein the micro features transmit charged particles from the reticle to the substrate and thus change a beam-current distribution over the corresponding region of the substrate relative to the beam-current distribution that otherwise would be achieved if the multiple-feature exposure unit lacked the micro features.

2. The method of claim 1, wherein the beam-current distribution over the region is configured to reduce one or more of distortion over the region, astigmatic blurring over the region, and local focus variations over the region caused by the Coulomb effect.

3. The method of claim 1, wherein step (a) comprises defining the pattern on an absorption-stencil reticle.

4. The method of claim 3, wherein step (a) further comprises defining the pattern on the reticle in multiple exposure units each defining multiple features of a respective portion of the pattern.

5. The method of claim 4, wherein:

each of multiple exposure units defining multiple features includes a respective high-feature-density portion and a respective low-feature-density portion; and micro features are defined in the respective low-feature-density portions.

6. The method of claim 1, wherein step (a) further comprises:

defining the pattern on the reticle in multiple exposure units each defining multiple features of a respective portion of the pattern, wherein each of multiple exposure units defining multiple features includes a respective high-feature-density portion and a respective low-feature-density portion; and micro features are defined in the respective low-feature-density portions.

7. The method of claim 1, wherein step (a) comprises defining the pattern on a scattering-stencil reticle.

8. The method of claim 7, wherein step (a) further comprises defining the pattern on the reticle in multiple exposure units each defining multiple features of a respective portion of the pattern.

9. The method of claim 8, wherein:

each of multiple exposure units defining multiple features includes a respective low-feature-density portion and a respective high-feature-density portion; and micro features are defined in the respective low-feature-density portions.

10. The method of claim 1, further comprising the step of correcting, based on the more uniform beam-current distribution, at least one of a focal-point position, distortion, and astigmatic blurring of the image as formed on the substrate.

11. A method for projection-exposing a pattern onto a sensitive substrate using a charged particle beam and a projection-optical system, the method comprising the steps:

(a) defining the pattern on a reticle, the reticle comprising a reticle membrane having a relatively high transmissivity to charged particles in the beam, the reticle membrane having formed thereon multiple negative features formed of a material tending to scatter or absorb more charged particles than absorbed or scattered by the reticle membrane, the reticle defining multiple exposure units each defining a respective portion of the pattern, wherein multiple exposure units each define multiple respective pattern features distributed in a respective high-feature-density portion and a respective low-feature-density portion of the respective exposure unit, each respective low-feature-density portion defining multiple micro features each sized below a resolution limit of the projection-optical system;

(b) illuminating a multiple-feature-defining exposure unit of the reticle using a charged particle beam such that a portion of the charged particle beam passing through the exposure unit becomes an imaging beam;

(c) projecting the imaging beam through the projection-optical system onto the sensitive substrate to form an image of the illuminated exposure unit on a corresponding region of the sensitive substrate, wherein the micro features of the illuminated exposure unit transmit charged particles from the reticle to the substrate and thus change a beam-current distribution over the corresponding region of the substrate relative to the beam-current distribution that otherwise would be achieved if the exposure unit lacked the micro features.

12. The method of claim 11, wherein the beam-current distribution over the region configured to reduce one or more of distortion over the region, astigmatic blurring over the region, and local focus variations over the region caused by the Coulomb effect.

13. The method of claim 11, wherein the micro features extend through selected scattering bodies of negative features in the low-feature-density portion.

14. The method of claim 13, wherein micro features additionally extend through both the scattering bodies and the membrane of negative features in the low-feature-density portion.

15. The method of claim 13, wherein micro features additionally extend through selected scattering bodies of negative features in the high-feature-density portion.

16. The method of claim 15, wherein micro features additionally extend through both the scattering bodies and the membrane of negative features in the high-feature-density portion.

17. The method of claim 16, wherein micro features additionally extend through selected positive features in at least the low-feature-density portion.

18. The method of claim 11, wherein the micro features are defined in positive features and in negative features.

19. The method of claim 11, further comprising the step of correcting, based on the more uniform beam-current distribution, at least one of a focal-point position, distortion, and astigmatic blurring of the image as formed on the substrate.

20. A method for projection-exposing a pattern onto a sensitive substrate using a charged particle beam and a projection-optical system, the method comprising the steps:

(a) defining the pattern on a reticle, the reticle including a low-feature-density portion that defines multiple features of the pattern and that defines at least one dummy feature;

(b) illuminating a region of the reticle, including the low-feature-density portion, using a charged particle beam such that a portion of the charged particle beam passing through the illuminated region of the reticle becomes an imaging beam;

(c) projecting the imaging beam through the projection-optical system onto the sensitive substrate to form an image of the region of the reticle on a corresponding region of the sensitive substrate, wherein the at least one dummy feature transmits charged particles in the beam from the reticle to the substrate and thus changes a beam-current distribution over the corresponding region of the substrate relative to the beam-current distribution that otherwise would be achieved if the region of the reticle lacked the at least one dummy feature.

21. A process for manufacturing a semiconductor device, comprising the steps of:
   (a) preparing a wafer;
   (b) processing the wafer; and
   (c) assembling devices formed on the wafer during steps (a) and (b), wherein step (b) comprises a method for projection-exposing a pattern onto the wafer as recited in claim 1.

22. A process for manufacturing a semiconductor device, comprising the steps of:
   (a) preparing a wafer;
   (b) processing the wafer; and
   (c) assembling devices formed on the wafer during steps (a) and (b), wherein step (b) comprises a method for projection-exposing a pattern onto the wafer as recited in claim 11.

23. A process for manufacturing a semiconductor device, comprising the steps of:
   (a) preparing a wafer;
   (b) processing the wafer; and
   (c) assembling devices formed on the wafer during steps (a) and (b), wherein step (b) comprises a method for projection-exposing a pattern onto the wafer as recited in claim 20.

24. A semiconductor device produced by the method of claim 21.

25. A semiconductor device produced by the method of claim 22.

26. A semiconductor device produced by the method of claim 23.

* * * * *